United States Patent
Vogel et al.

(10) Patent No.: US 11,590,528 B2
(45) Date of Patent: Feb. 28, 2023

(54) TOOL FIXTURE FOR MULTIPLE PROCESS STEPS

(71) Applicant: Oerlikon Surface Solutions AG, Pfäffikon, Pfäffikon (CH)

(72) Inventors: Remo Vogel, Buchs (CH); Max Siebert, Bolanden (DE); Mario Rombach, Buchs (CH); Philipp Bartholet, Azmoos (CH); Masar Demiri, Lengnau (CH); Dieter Mueller, Bingen am Rhein (DE); Sven Hegersweiler, Mainz (DE); Sebastian Benedikt, Feldkirch (AT); Roger Walt, Balzers (LI)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 609 days.

(21) Appl. No.: 16/485,388

(22) PCT Filed: Feb. 16, 2018

(86) PCT No.: PCT/EP2018/000063
§ 371 (c)(1),
(2) Date: Aug. 12, 2019

(87) PCT Pub. No.: WO2018/149548
PCT Pub. Date: Aug. 23, 2018

(65) Prior Publication Data
US 2019/0388931 A1 Dec. 26, 2019

Related U.S. Application Data

(60) Provisional application No. 62/459,665, filed on Feb. 16, 2017.

(51) Int. Cl.
*B05C 13/02* (2006.01)
*B25B 11/00* (2006.01)
(Continued)

(52) U.S. Cl.
CPC ............ *B05C 13/025* (2013.01); *B23P 19/04* (2013.01); *B25B 11/00* (2013.01); *C23C 14/505* (2013.01);
(Continued)

(58) Field of Classification Search
CPC .... A47F 5/02; A47F 5/025; A47F 5/04; A47F 5/05; B25H 3/06; B25B 11/00; Y10S 269/90
See application file for complete search history.

(56) References Cited

U.S. PATENT DOCUMENTS

| 10,072,326 B2 | 9/2018 | Siebert et al. |
| 2007/0057138 A1* | 3/2007 | Esser ................... C23C 14/505 248/349.1 |

(Continued)

FOREIGN PATENT DOCUMENTS

| CN | 201565773 U | 9/2010 |
| CN | 103261475 A | 8/2013 |

(Continued)

OTHER PUBLICATIONS

Chinese office action dated Aug. 4, 2021 in related Chinese application 201880012485.2.

(Continued)

*Primary Examiner* — Tyrone V Hall, Jr.
(74) *Attorney, Agent, or Firm* — Polson Intellectual Property Law, PC; Margaret Polson; Christopher Sylvain (57) ABSTRACT

The present invention discloses a tool holding device for shank type tools, comprising at least one tool holder, a base part and a top part, whereby at least the top part comprises uptake holes for the at least one tool holder characterized in that, the tool holding device can be used for more than one process step among transfer, cleaning, pretreatment, coating, posttreatment, and each of the at least one tool holders can (Continued)

optionally take up a sleeve holding the shank type tool in a distinct, preferably upright position and comprises one or more openings, which allow fluid and/or solid treatment agents to exit the tool holder and/or sleeve and the at least one tool holder and/or sleeve enables three-fold rotation of the shank type tool. Further a method using the inventive tool holding device is disclosed.

15 Claims, 5 Drawing Sheets

(51) Int. Cl.
| | |
|---|---|
| *C23C 14/50* | (2006.01) |
| *B23P 19/04* | (2006.01) |
| *H01J 37/32* | (2006.01) |
| *C21D 9/00* | (2006.01) |
| *F27D 5/00* | (2006.01) |
| *B23P 15/32* | (2006.01) |
| *B23Q 3/155* | (2006.01) |
| *B23B 27/14* | (2006.01) |
| *B23P 15/28* | (2006.01) |

(52) U.S. Cl.
CPC ........... *B23B 27/14* (2013.01); *B23B 2228/10* (2013.01); *B23P 15/28* (2013.01); *B23P 15/32* (2013.01); *B23Q 3/155* (2013.01); *C21D 9/0025* (2013.01); *F27D 5/005* (2013.01); *H01J 37/32715* (2013.01); *Y10S 269/90* (2013.01)

(56) References Cited

U.S. PATENT DOCUMENTS

| | | | |
|---|---|---|---|
| 2011/0247553 A1 | 10/2011 | Wu | |
| 2016/0076131 A1* | 3/2016 | Siebert | ............ H01J 37/32715 |
| | | | 118/503 |

FOREIGN PATENT DOCUMENTS

| | | |
|---|---|---|
| CN | 204251698 U | 4/2015 |
| CN | 105127065 A | 12/2015 |
| CN | 105579611 A | 5/2016 |
| CN | 105779947 A | 7/2016 |
| DE | 1012013107375 A1 | 1/2015 |
| WO | 2009149864 A1 | 12/2009 |
| WO | 2012089306 A1 | 7/2012 |
| WO | 2015004021 A1 | 1/2015 |

OTHER PUBLICATIONS

Chinese office action dated Jan. 4, 2021 in related Chinese application 201880012485.2.
International Search Report dated Aug. 23, 2018 in parent International application PCT/EP2018/000063.
Written Opinion of the International Searching Authority dated Aug. 23, 2018 in parent International application PCT/EP2018/000063.

* cited by examiner

TOOL FIXTURE FOR MULTIPLE PROCESS STEPS

The present invention relates to a tool holding device for shank type tools, comprising at least one tool holder or sleeve, which enables—in particular one or more out of—a manifold of possible process steps, such as e.g. transfer, cleaning, pre- and/or posttreatment and coating of at least parts of the surface of the shank type tools. The tool holder or the adapter belonging thereto, exhibits one or more escape openings that allow solid and/or fluid and/or gaseous treatment agents leaving the tool holder before the next process step is applied.

The present invention relates furthermore to a tool plate unit and a tool carousel equipped with such tool holding devices, the particular use of such tool holding devices and a surface treatment method for shank type tools, comprising transfer, cleaning, optional pre- and/or posttreatment and deposition of coatings on at least parts of tool surfaces, using the aforementioned device.

TECHNICAL BACKGROUND

Nowadays most commercially available shank type tools, such as e.g. drills, mills, taps, punches or the like are coated with protective and or functional thin films in order to enhance their performance during operation. These thin films or coatings are mostly applied via physical or chemical vapor deposition techniques, such as e.g. electron beam evaporation, the diverse methods of magnetron sputtering, arc ion plating, chemical vapor deposition with and without plasma assistance, and so on. The coating material and/or deposition process strongly depends on the final tool application but also on tools substrate material and geometry. A lot of different types of coatings, such as e.g. pure metallic coatings (e.g. Chromium, Titanium, etc.), metal-ceramic type coatings (e.g. CrN, TiN, TiAlN, CrAlN, etc.), and even ceramic type coatings (e.g. $Al_2O_3$, $Cr_2O_3$, $ZrO_2$, etc.), or the group of carbon based coatings (e.g. synthetic diamond, ta-C, a-C:H, or metal-doped carbon coatings), exhibit outstanding, often specific properties. The expert in the field will thus select for individual machining operations not always the same coating, but rather dedicated coating systems and combinations therefrom in order to achieve best performance in the final application.

It is further widely accepted that cleaning of the tool surface prior to deposition of the protective coatings is crucial for coating adhesion and thus performance. The cleaning can be done e.g. in aqueous solutions of organic and/or anorganic cleaning agents (e.g. isopropanol, acetone, alcohol, etc.) or in a plasma. Also it is generally known that the tool surface and/or microgeometry of the tools can be modified prior to deposition by one or more pretreatment steps, such as e.g. brushing, microblasting, wetblasting, or the like. In an akin manner coated tools are often posttreated after deposition, which e.g. allows for reduction of surface roughness, increase gloss, etc., and can effectively enhance the tool performance. Also for posttreatment of shank type tools e.g. brushing, microblasting, wetblasting, magnetfinish, or the like are well known practices to the expert in the field.

For performing, for example, a pretreatment with subsequent coating deposition and a posttreatment hereinafter the tools have to be manually handled for several times, e.g. by 1) loading the tools in transfer boxes for delivery to the job coater, 2) unloading from the box and loading in dedicated tool holders for cleaning, 3) unloading and loading the cleaned tools in tool holders for pretreatment, 4) unloading and loading the pretreated tools in tool holders for deposition of the coating, 5) unloading and loading the coated tools in tool holders for posttreatment, 6) unloading and loading in delivery boxes for transfer back to the customer. The high number of manual handling steps is labor consuming and bears the possibility of tool damages due to loading and unloading in individual tool holders.

STATE OF THE ART

Several aspects are crucial for enabling industrially successful surface treatment of shank type tools.

One major aspect is the economical need to coat as many tools in one batch as possible.

Usually shank type tools are mounted on or in tool holders on turntables in batch type coating systems. The loading density of shank type tools is usually satisfying if the batch to be treated completely consists of a number of identical shank type tools. Problems arise if the batch to be treated consists of a number of shank type tools with a very different geometry or very different shank diameters. Several attempts have been made in the past to firstly optimize the loading density of shank type tools, and secondly enhance coating homogeneity independent of the local positioning in the deposition chamber during the coating process.

Exemplarily, WO2012089306 proposes a hollow holder for drills, with at least three walls in a sandwich arrangement, which supports the drills during the deposition process in a way that the tool tip faces the coating material sources. This holder can carry a multitude of drills hold in a star-like positioning and allows for homogenous deposition of coatings in the tip region of the drills. In cases however, in which also a high homogeneity of coating thickness and properties is required along the mantle surface of the shank type tool, as for example necessary for properly coating milling tools, this tool holder exhibits considerable drawbacks.

To increase coating thickness homogeneity in such cases, it is preferred to apply a threefold rotation to the shank type tools, which have thus to be mounted individually in separate tool holders.

A sophisticated approach for increasing the loading density is disclosed in WO2009149864.

There a workpiece carrier for rotary symmetric tools is suggested, wherein the shank type tools are mounted in individual holders, that are mounted inside discs which exhibit openings, in a distinct angle. The discs can then be positioned one on each other to form a tree-like holder. Thereby, the tools protrude from the holders as much as necessary to coat only the tool surface which is intended, while the shank of the tools is effectively protected from unintended deposition of coating material. This approach further comprises means for mechanically triggering the rotation of the individual tool holders, which results simultaneously in a high loading density and threefold rotation of the shank type tools.

This workpiece holder requires a high effort for loading and unloading the manifold of tools into and out of the tool holder.

Moreover it is difficult to adapt this workpiece holder if a batch is to be treated that is composed of a number of very different workpieces that need individual fixation to the said workpiece holder. So another important drawback of the above mentioned state-of-the-art consists of the high costs for dedicated tool holders, which can only be used for distinct tool geometries and sizes.

Also it is possible that during loading and unloading of the tools, or even during the coating process, dust or coating particles fall down from the tools or holders above, which can result in local coating growth defects on the tool surface where the impurities are buried.

Another aspect is that the handling effort for the individual tools should be as low as possible. This means that the total handling time, e.g. for manual loading and unloading of tools, should be as low as possible.

In addition, the known tool holder concepts only allow the use of the tool holders for the deposition of the coating but not for using the same tool holding device for cleaning, pre-/posttreatment or transfer from one location to the other.

OBJECT OF THE INVENTION

The present invention thus intends to overcome or at least to reduce one or more of the above mentioned drawbacks.

So it is one object of the present invention to provide a tool holding device, comprising at least one tool holder or adapter (sleeve), which can be used for transfer, cleaning, pre- and/or posttreatment, and coating of shank type tools.

It is another object of the invention to reduce the handling effort and preferably the possibility of damage, of the individual tools. Ideally said reduction is accompanied by improving the homogeneity of adhesion, thickness distribution and properties of the deposited coatings Finally it is an object of the invention to attain a higher space utilization and to improve the suitability of the workpiece holder for carrying out a batch production process requiring the synchronous treatment of workpieces with different geometries and/or shank diameters.

The Inventive Solution

According to the invention an innovative holding device is proposed for shank type tools, comprising at least one, preferably more, ideally at least four tool holders for holding a shank type tool in a distinct upright position and in rotatable manner.

An upright position is preferably a position in which the axis around which the shank type tool rotates under operation, has a vertical position. Even if the expression "upright" is not restricted to this definition it is in each case kept if the tolerances of +/−10° better +/−5° are kept, related to a perfectly vertical line.

In its narrowest sense the expression "shank type tool" means a tool for material shaping which is clamped along the circumference of its cylindrical, conical or polygonal shaft for purpose of operation, for example milling.

Holding in a distinct position means normally holding separated and with distance to neighbored tools. In most cases it means without detrimental play between the tool holder and the tool shank. In most cases this means, too, a holding that makes sure that the tool can rotate together with the tool holder without slip.

The inventive the tool holder is equipped with a topside tool or adapter insertion opening giving access to a cavity which holds the tool shank in said manner by means of friction, directly or by means of the adapter between the shank and the tool holder.

Moreover the inventive tool holding device comprises a base part and a top part. At least the top part comprises an uptake hole for partially embracing the circumferential surface of the at least one tool holder. A from fit or preferably a pure friction fit between the uptake hole and the tool holder is realized. Normally one and the same top part comprises a number of such uptake openings, ideally at least four.

The said the base part forms a support and/or an uptake and/or a guide for the at least one tool holder. For that purpose the base part may have an own uptake opening for the tool holder, maybe one with a smaller diameter that that one of the top part.

In each case the base part and the top part are interconnected to each other by means of at least one better at least two spacers.

According to the invention the at least one tool holder comprises one and preferably more escape openings which are positioned in vertical direction below the tool or adapter insertion opening and which allow fluidal and/or solid treatment agents to exit the tool holder that way that the tool holding device can be used for more than one process step among transfer, cleaning, pretreatment, coating, posttreatment. In many cases such an escape opening is only an opening that is designed and positioned that way that intruded liquids can fully escape through it by means of gravity. On the other hand it is often worth to design the at least one escape opening that way it extends along the major length, preferably at least 75% of said length, of the longitudinal or tertiary axis of the tool holder through the circumferential jacket of the tool holder. That way it is prevented that particles or liquids intruded are hold in place by means of capillary forces produced by the narrow slot between the circumferential surface of the shank and the inner circumferential surface of the tool holder accommodating it. Said escape opening is mostly straight but in other cases it can have a helical extension.

As a rule the tool holders should in that region that extends through the top part into the outside area not be equipped with openings other than the tool or adapter insertion opening. That means the escape opening should always be positioned (only) in the area sandwiched between the top plate and the base plate.

This design of the inventive tool holder has the effect that particles or liquids that are intruded into the gap between the tool shank and the tool holder accommodating the shank during pretreatment or post treatment can be removed more easily later. The removal can be driven by gravity and/or partial evaporation, which influences the design and positioning of the escape openings.

That way it becomes possible for first time to use the innovative tool holding devices for performing, in addition, other treatments than layer deposition without the necessity to use different tool holding devices. The tool can stay all the time in the same tool holding device which can—grace to the escape openings—sufficiently be freed from residual blasting or cleaning agents before being used in order to put the tools into the deposition chamber—which is not allowed to be contaminated by said agents.

According to the invention another proposed solution is tool holding plate unit for shank type tools, comprising at least one, preferably more tool holding devices of the inventive type and a plate taking up the at least one tool holding device in a defined position, whereas the plate possesses a central hub for fixing the tool holding plate unit to a stem of a tool holding tree and preferably a circumferential jacket. The tool holding plate unit and preferably the hub thereof comprises form fit means nesting with complementary form fit means of a tool holding device. That way that the tool holding device is locked in a predetermined position with the tool holding plate unit, preferably in the interspace between its hub and its circumferential jacket. The locking is designed that way that it prevents the tool holding device from rotating relatively to the tool holding plate unit. In most cases the said locking can be established and released without the need of using a tool, preferably by straight lifting of the tool holding device Alternatively a quick-lock device is used designed that way that a locking or unlocking can take place in less than 1.5 seconds.

That makes it possible to use identical tool holding plate units for very different types of tools and/or shank diameters by equipping it from case to case with the tool holding devices required in the individual case.

That makes it easier to fully load each tool holding plate. A better exploitation of the space available is the consequence.

Moreover, the handling for performing different steps like pretreatment, subsequent coating and, maybe, posttreatment becomes easier.

It is not necessary anymore to grip every tool under treatment individually in order to transport it or to fix it individually at the holder required for performing the next following treatment step. Instead the inventive tool holding unit serves for transporting and/or holding the tools throughout the complete process chain or throughout at least two or more steps thereof. It is for example significantly less time consuming if the tools can be transferred from a pretreatment step (maybe a cleaning) into a tool holding plate unit for coating by doing nothing else than lifting one or some inventive tool holding devices—each equipped with a plurality of tools to be treated—into the tool holding plate unit later serving for positioning the tools on the deposition carousel.

For sake of completeness there are still some general remarks to be made, as follows.

In batch type coating systems one or more inventive tool holding devices can be arranged above each other on a shaft, which is mounted on a carousel. The carousel of a batch coating system undergoes rotation during operation, which is referred to "single-rotation" in the present discussion. Typically, the one or more shafts are positioned circumferentially around the central axis of the carousel and rotate themselves around their shaft axis, which is referred as "double-rotation" in this discussion. Usually the rotation of the shaft is performed by a fixed transmission between the shaft and the carousel. The present invention relates to a tool holding device, which comprises one or more tool holders and/or sleeves that hold shank type tools in a distinct, preferably upright, position, while enabling for an additional rotation around the tool axis, which is referred as "three-fold rotation" in this discussion.

Figure 1:
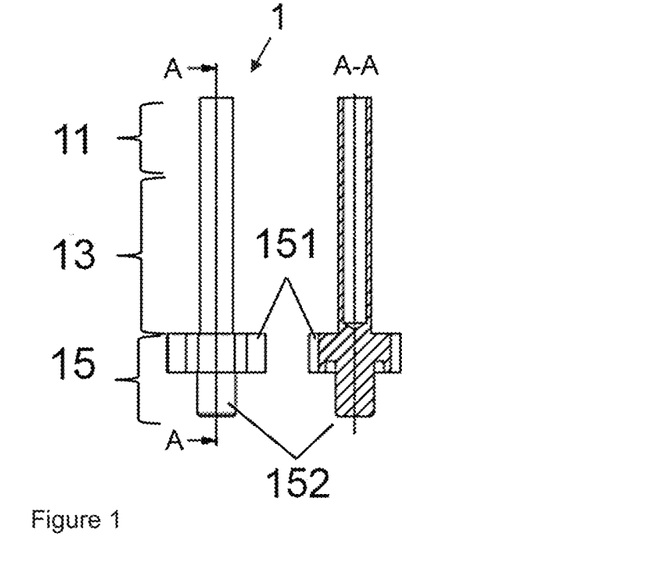
FIG. 1: A schematic drawing of a tool holder device as known in the field.

FIG. 1 shows a typical tool holder 1 as known in the field. The tool holder generally comprises three regions along its rotation axis A-A. For an easier discussion in the following, the tool holder regions are named as top region 11, a mantle or center region 13 and a base region 15. As can be seen in FIG. 1, the tool holder consists of a tube, forming the top 11 and mantle region 13. To enable a three-fold rotation of the tool holder, the base region 15, whereon or wherein the tube is fixed, has a larger diameter than the top and center region and contains notches 151, where a mechanical trigger or spring (not shown here) can grab in during operation. The lower part of the base region 15 exhibits a round protrusion 152, which ensures that the tool holder cannot fall off the disc shaped tool carrier plate (not shown here), where the tool holders are circumferentially mounted. This tool holder can be basically used for cleaning, pre-/posttreatment and coating of the shank type tools. However, liquid and/or solid cleaning or pre-/posttreatment agents which are intended to interact with the tool surface that is not protected by the tool holder, will be collected at the bottom inside the tool holder. This disadvantage prevents from using the same tool holder for more than one process step, since remaining cleaning agents and/or blasting media from the pretreatment would act as contaminants during deposition and deteriorate the coating quality.

The objective of the present invention is attained by providing a tool holding device for shank type tools, which comprises at least one open and light tool holder and/or sleeve, which enables a manifold of possible process steps, such as e.g. transfer, cleaning, pre- and/or posttreatment and coating of at least parts of the surface of the shank type tools. Each tool holder and/or sleeve of the tool holding device, exhibits one or more openings that allow solid and/or fluid and/or gaseous treatment agents to react with at least parts of the tool surface as well as leaving the tool holder before the next process step is applied. The tool holder and/or sleeve possesses means for enabling three-fold rotation of the individual tools in random or fixed motion.

Figure 2:
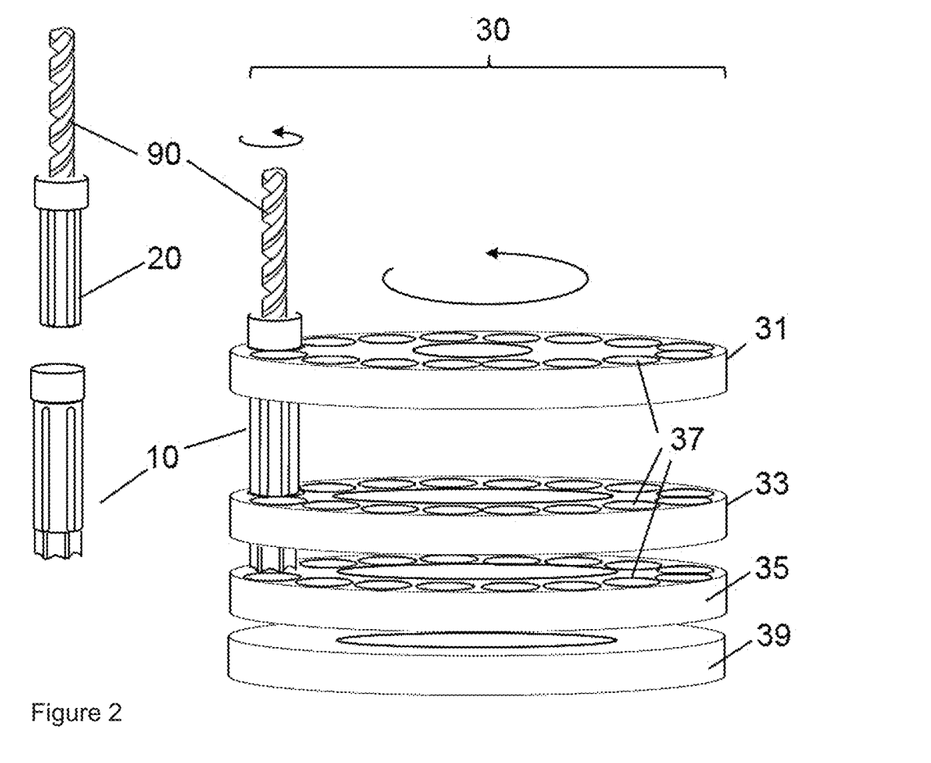
FIG. 2: A schematic drawing of an inventive tool holding device 30.

The following explanations should clarify the used nomenclature of the individual parts of the inventive tool holding device in the context of the current invention. A schematic illustration of the individual parts is presented in FIG. 2:

a) A tool holder 10 is a constructive element, which is intended to hold a shank type tool 90 in a distinct, preferably upright, position and enabling for rotation around the main tool axis during the individual process steps. The tool holder should be a part of the tool holding device 30.

b) An adapter—sometimes also called sleeve 20—is a constructive element, which is intended to hold a shank type tool 90, similar to a tool holder 10, e.g. to adopt for different tool diameters of the tool holder 10 and the shank type tool 90. A sleeve 20 can be optionally inserted in a tool holder 10.

c) The tool holding device 30 is an assembly comprising at least one tool holder 10 and/or sleeve 20, a carrier plate 31 or top part 31, and optionally a base part 35 and a center part 33, which is also referred as lock washer part 33. The tool holding device usually designed to be able to undergo a two-fold rotation by being mounted on or around a shaft (not shown in this presentation) and is intended as an uptake for the three-fold rotating tool holders and/or sleeves in uptake holes 37. The tool holding device 30 can further comprise constructive means 39 for enabling three-fold rotation of the tool holder and/or sleeve. The tool holding device can further comprise a protective ring (not shown in this presentation), surrounding the tool holding device at its outer diameter.

The present invention and preferred embodiments will be explained in the following in more detail and exemplarily supported by figures. The following explanations and examples are not intended to limit the present invention but to help to understand the invention and to show ways in which the invention can be put into practice.

The explanation of the preferred embodiments will reveal additional functions, design options and useful technical effects.

EMBODIMENTS OF THE PRESENT INVENTION

Figure 8:
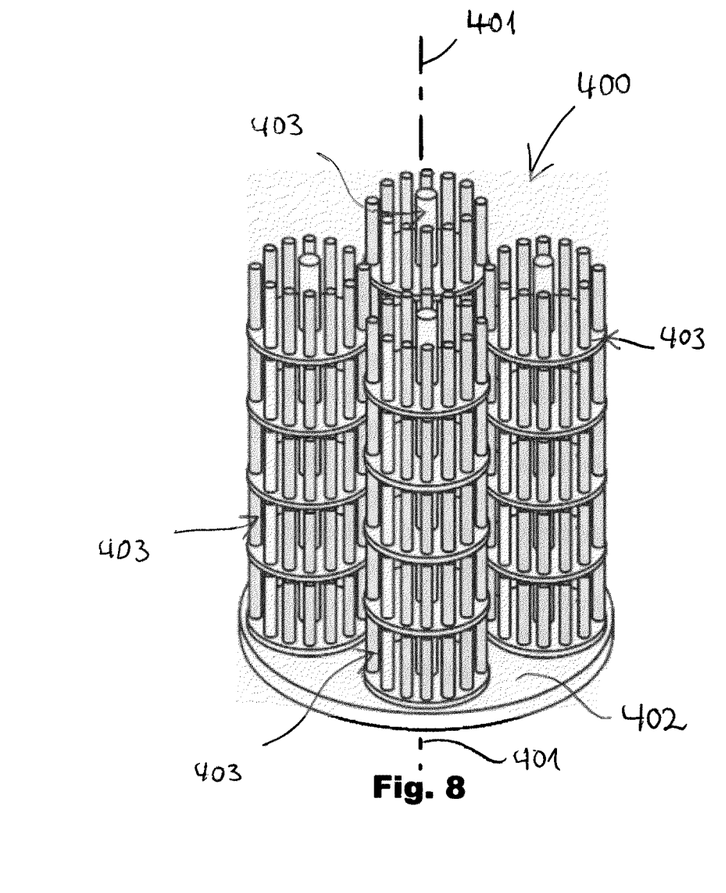
FIG. 8: A tool holding carousel equipped with tool holding trees formed out of a number of inventive tool holding plate units each.

FIG. 8 illustrates a tool holding carousel 400 which is so designed that it can rotate about a primary axis 401. The carousel 400 is designed to be operated in the deposition chamber of an according deposition machine.

FIG. 8 illustrates a tool holding carousel 400 which is so designed that it can rotate about a primary (own) axis 401. The carousel 400 is designed to be operated in the interior of the deposition chamber.

The carousel 400 normally comprises a carousel base plate 402. As shown by FIG. 8 the carousel normally carries a number of tool holding trees 403. The trees are placed in rotatable manner in the carrousel, so that each single tree can rotate about a respective secondary (own) axis 404.

Figure 9:
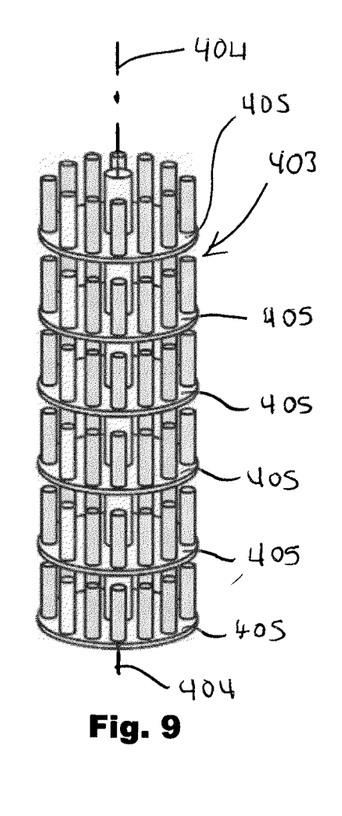
FIG. 9: One single tool holding tree formed out of a number of inventive tool holding plate units one above the other.

One of this tool holding trees 403 is shown in greater detail by FIG. 9. Each of these tool holding trees 403 is designed to rotate relatively to the base plate 402 of the carousel 400 around the secondary axis 404.

Figure 10:
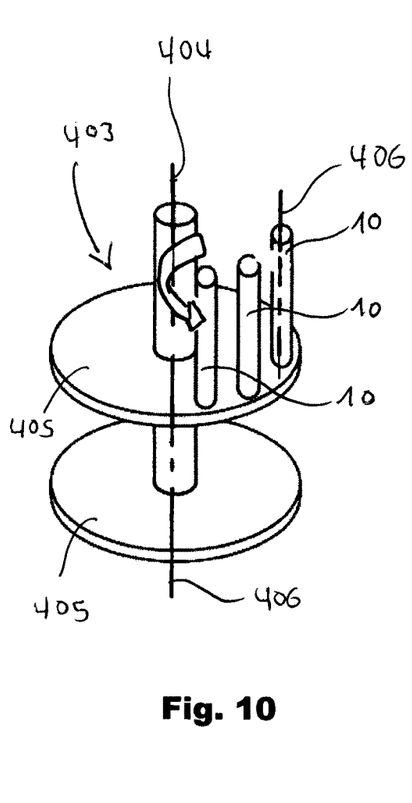
FIG. 10: A basic, rough sketch of the inventive tool holding plate units.

As shown in greater detail by FIG. 10 each of the trees 403 comprises a number of tool holding plate units 405.

As explained in greater detail later, the tool holding plate units 405 of one single tree 403 are positioned one above the other along the secondary axis of rotation 404. As only very roughly shown by FIG. 10 each of the tool holding plate units 405 carries a number of tool holders 10. What is not shown by FIG. 10 is that the tool holders 10 are borne or hold by a base part and a top part. However, what is clear is that each of the tool holders is preferably hold rotatably in the said top part 32 and by means of base part 35. For that reason, it is a very preferred design that each of the tool holders is able to rotate around a tertiary axis 406 and relatively to the tool holding plate unit 405. Said tertiary axis 406 is the longitudinal axis of the tool holder 10 itself.

In consequence the tool holders 10 are subjected under operation to threefold rotational movement. That way the layer deposition will be very uniform since it is prevented that one side of the tool holder with the tool being hold thereon is for a longer time closer to the deposition sources than the rest of the tool.

Primary axis 401 of the tool holding carousel 400 is equipped with means that generate rotation of the tool holding trees 403. For the same purpose every secondary axis 404 of the tool holding tree 403 is equipped with one or more means that generates rotation of the tool holders 10.

In the next step one of the inventive tool holding plate units 405 will be explained in greater detail.

Figure 5:
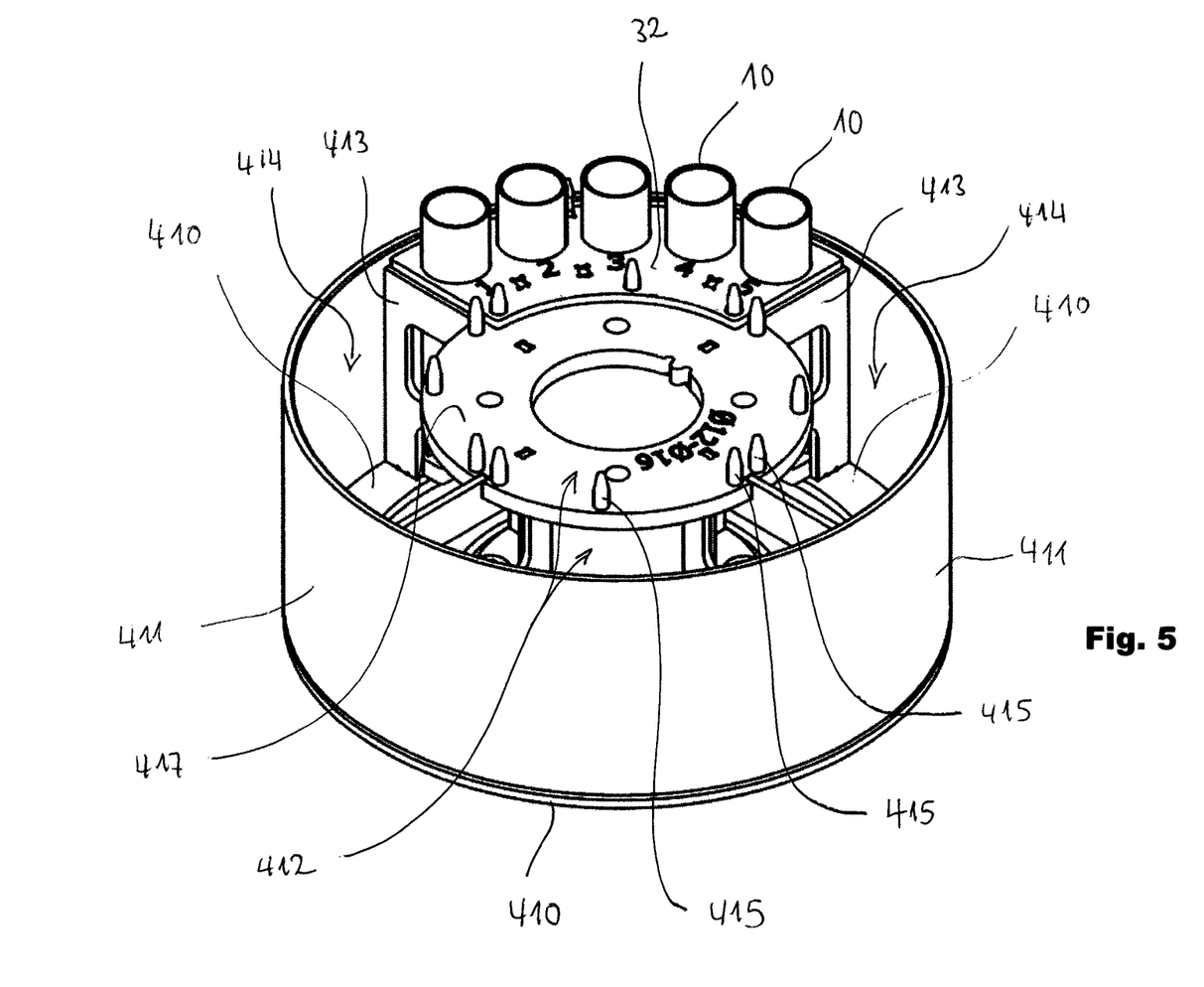
FIG. 5: An inventive tool holding plate unit equipped with four of the inventive tool holding devices.

An embodiment of such a tool holding plate unit 405 is shown by FIG. 5. A tool holding plate unit 405 is provided for forming the above mention tool holding tree and serves therefore for coating. The tool holding plate unit is formed by a plate 410. The plate 410 a fully or essentially closed plate.

For sake of completeness it has to be mentioned that the holders which can be used in order to accommodate the tool holding device or devices for pre- or post-processing preferably have a structure very similar to that one of the tool holding plate units, while they are not bound for becoming a part of the said tool holding carousel. Rather often their plate corresponding to plate 410 is equipped with a number of windows making removal of residual treatment agent easier. Sometimes these holders have no jackets for the same reason. Beyond that these holders can be identical to that ones used for coating.

Back to the tool holding plate units 405 provided for the coating process: In every case it is of advantage, if the tool holding plate unit 405 is equipped with a circumferential jacket 411. The circumferential jacket 411 prevents coating material from unimpeded coming into contact with the tool holders and the shaft portions of the tools to be treated.

Moreover each tool holding plate unit 405 is preferably equipped with a hub 412 that normally extends above the plate 410 in upward direction. The hub 412 serves for bearing the tool holding plate unit 405 one above the other on the secondary axis 404.

In the preferred embodiment, as shown by FIG. 5, the interspace between the circumferential jacket 411 and the hub 412 forms a groove for accommodation of the tool holding devices 30 with its tool holders inserted. Said groove is in its circumferential direction divided by means of partition plates 413 into a number of compartments, preferably four ideally identical compartments 414.

The hub 412 processes at its uppermost side preferably a flange in the shape of a disc plate with a hollow centre. This disc plate ist forming a collar extending in radial outward direction beyond the tubular body of hub 412.

Figure 6:
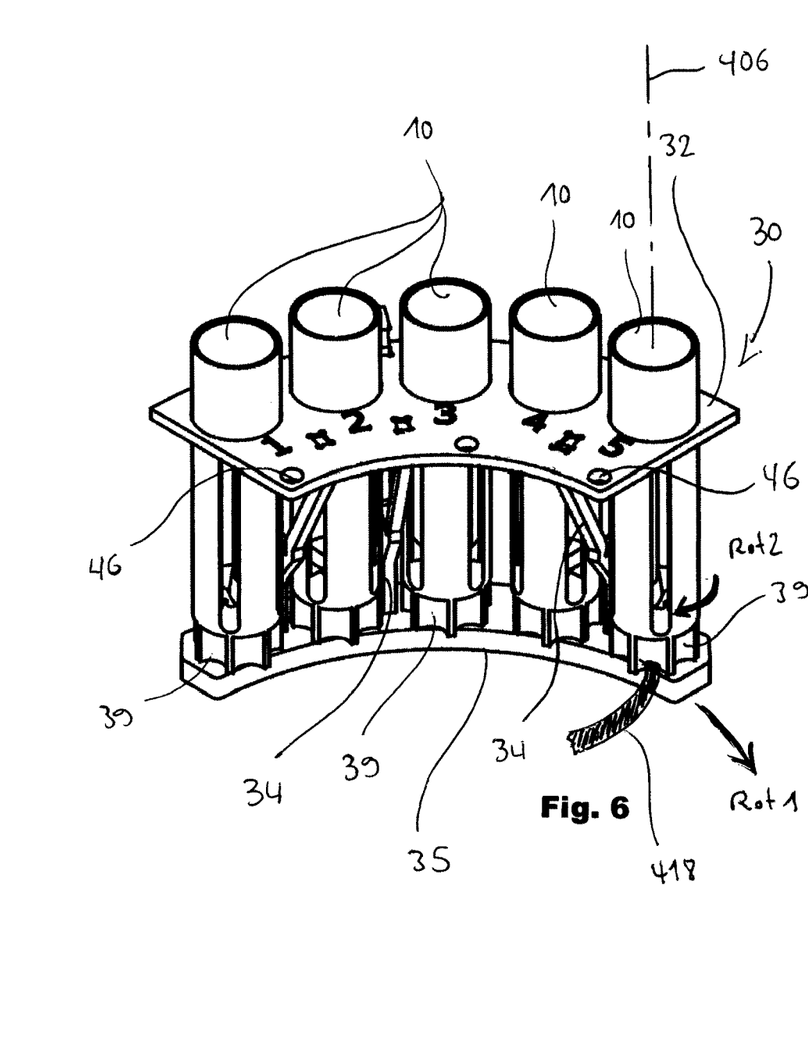
FIG. 6: One of the inventive tool holding devices shown by FIG. 5 in a state lifted out of the tool holding plate unit, seen from its radial inward side.

As it can be seen from FIGS. 5 and 6 each of the tool holding plate units 405 accommodates one or preferably more tool holding devices 30.

Figure 7:
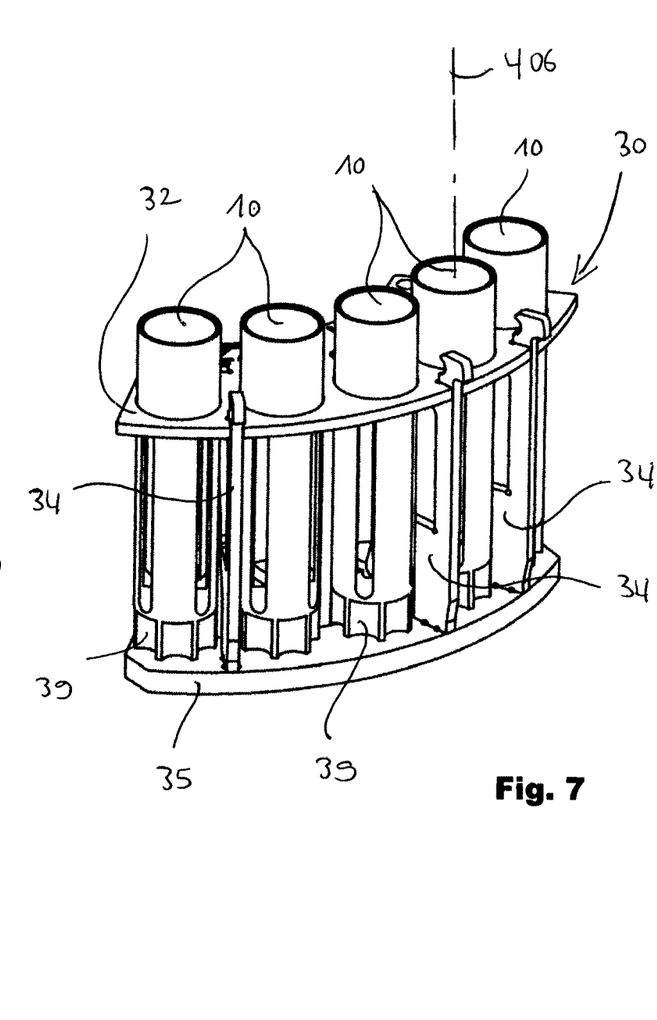
FIG. 7: One of the inventive tool holding devices shown by FIG. 5 in a state lifted out of the tool holding plate unit, seen from its radial outward side.

How such a tool holding device is preferably constructed can be seen rather from FIGS. 6 and 7. A said tool holding device 30 comprises at least a carrier plate 31 and a base plate 35. Said two plates are hold together by two or preferably more spacers 34. In this particular case figured out here every spacer 34 forks above its basis into two arms, one arm supporting the outside portion of the carrier plate 31 (see FIG. 7) and the other arm supporting the inside portion of the carrier plate 31 (see FIG. 6).

In case that the tool holding plate unit 405 accommodates only one tool holding device 30 the said carrier plates 31 and base plates 35 have preferably a fully circular shape, a detail that will be explained later on. In case of the embodiment depicted by FIGS. 6 and 7 the tool holding devices 30 have each the shape of an arc of a circle (or an arc of a hollow cylinder wall) which is confined by two radii and two arcs. That means that each of the carrier plates 31 and the base plates 35 and, if existent, of the centre parts 33 has such a shape of an arc of a circle confined by two radii and two arcs.

As can be seen very when considering FIGS. 5 up to 7 the carrier plate 31 forms a number of uptake holes 37 for the tool holders 10. It goes without saying that tool holders 10 for tools with shaft of a bigger diameter, have themselves a bigger diameter or need at least more space. For that reason different types of tool holding devices 30 exist, each predetermined for tools with a certain diameter.

The advantage in such a division of a fully circular tool holding device 30 into a number of according tool holding devices 30, that are only partially of circular shape, is that the available space can be fully used more easily. This is because it doesn't cause a problem if for example only a 5 tools with one type shaft diameter (for example 16.5 mm) need to be coated this time while all 15 tools have a different type shaft diameter (for example 17.0 mm). In this case the tool holding plate unit 405 can individually be equipped with different tool holding devices 30 as being required this time.

In order to need not too much different tool holding devices adapters can belong to the system. Such an adapter has typically the form of sleeve or tube with a defined outside diameter as required by the tool holder for pairing and a defined internal diameter as required by the shank of the tool for pairing.

Moreover the division of fully circular tool holding devices 30 into a number of according tool holding devices makes the handling easier. That means for example that the smaller, only partially circular tool holding devices 30 can be removed from the tool holding plate unit 405 more easily, in order to clean it together with the tools sticking therein for example, or to mount it to another tool holding plate unit, for example of such a type that is used for post- or pre-treatment.

As can be seen from FIGS. 6 and 7 each of the tool holders 10 is equipped, preferably at its lowermost end, with a constructive means 39 for enabling the 3-fold rotation, or, more precisely spoken, with a constructive means 39 for enabling the rotation around the tertiary axis 406.

Said constructive means 39 are preferably designed as a kind of teeth. These teeth mostly cooperate with a leaf spring (mostly not shown here, very roughly sketched in FIG. 6 as part 418) that moves the tool holder 10 an amount referenced as "Rot 2" around the tertiary axis 406 as soon as the tool holder 10 comes on its rotational path referenced as "Rot 1" so close to the leaf spring that its tip engages into one of said kind of teeth.

It is clear that this kind of movement can produce a torque that tends to move each tool holding device 30 relatively to the tool holding plate unit 405 in circumferential direction.

For that reason it is important that the single tool holding device 30 or, if a plurality, each of the tool holding devices 30 is locked in a predetermined position in regard to the tool holding plate unit 405. For accomplishing this the tool holding plate unit 405 or, more precisely spoken, preferably its hub 412, is equipped with a number of form fit means. The said form fit means are embodied preferably in the shape of pins 415, ideally extending parallel to the secondary rotational axis. The pins 415 will in mounted stage protrude through according holes 416 embodied preferably in the carrier plate 31. The said holes 416 serve as complementary form fit means. That way a rotational movement of the tool holding device 30 relatively to the tool holding plate unit 405 is prevented.

At the same time the said form fit means of the of the tool holding plate unit 405 and the complementary form fit means of the tool holding device 30 guarantee always a correct pairing/positioning of the tool holding plate unit 405 and the tool holding device(s) 30. At this point one has to know that each tool holding plate unit 405 can only accommodate tool holding devices 30 for tools with a certain range of shaft diameter. So it is for example possible for the tool holding plate unit 405 to accommodate tool holding devices 30 with shaft diameters between 12 mm and 16 mm. This is because the above-mentioned leaf spring has a length that can operate within this is diameter range, only. For accommodating and properly operating tool holding devices 30 with shaft diameters between 16.5 mm and 20 mm, for example, tool holding plate units 405 with shorter leaf springs are required and provided.

As one can see from FIG. 5 for each tool holding device 30 at least two, preferably three pins 415 are provided. The pins do not have all an equidistant position in circumferential direction but an individual position. The pins are positioned so, that only those tool holding devices 30 match with these pins 415 that are allowed to be operated in the according tool holding plate unit 405.

A detail that can be seen by means of FIG. 7 is the fact that the tool holder device 30 is preferably equipped with at least on coupler protrusion 34. The coupler protrusion 34 is positioned that way that it can be gripped with a tool from above the base plate 32, in order to lift the complete tool holding device out of the tool holding plate device. An appropriate tool has preferably the shape of a pincer.

The coupler protrusion is preferably an integral portion of a spacer 34.

Figure 3:
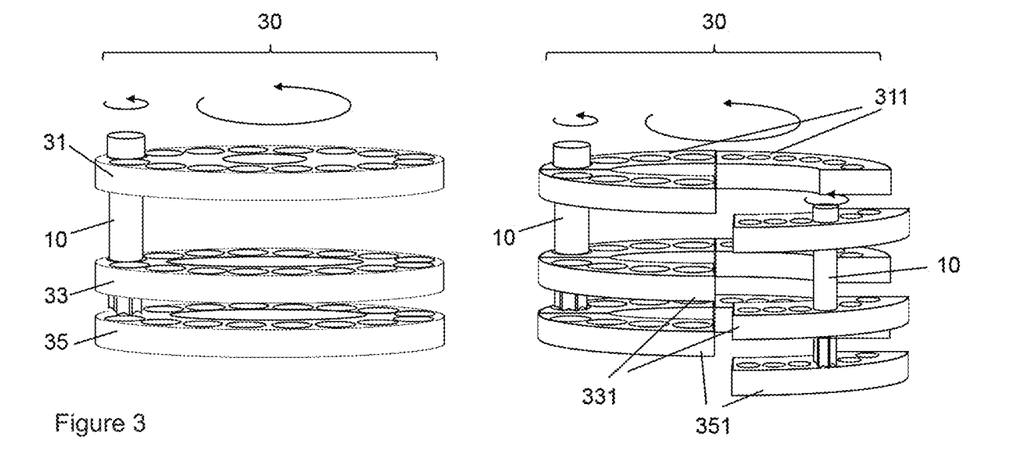
FIG. 3: A schematic drawing of inventive tool holding devices 30, in the shape of continuous structural elements in disc shape (left illustration) and a segmented structural element (right illustration).

FIG. 3 presents a very schematic illustration of the inventive tool holding device 30, being either composed of continuous structural elements, e.g. disc shaped base part 35, top part 31, and optional lock washer part 33, or of segmented structural elements, e.g. segmented base parts 351, segmented top parts 311 and optional segmented lock washer parts 331. The segmented structural elements have to be manufactured in a way that they can be inserted into a tool holding plate unit with a closed circle as outer diameter. A tool holding plate unit can thus be equipped by at least two, preferably less than 12 segments, each comprising one segmented base part 351, one segmented top part 311 and optionally one segmented lock washer part 331. The lock washer part is intended to stabilize the tool holder and/or sleeve during three-fold rotation, for this purpose the base part 35 and the lock washer part 33 form a support directly above and below 39 constructive means for enabling 3-fold rotation, see FIG. 3.

It is further a preferred embodiment of the present invention that the individual segments can exhibit a different number and size of uptake holes 37. This allows that a combination of tools with different tool diameter and/or size being treated simultaneously if the tool holding device is assembled of two or more different segments, wherein different tool holders and/or sleeves with proper diameter and/or size for the individual tools are mounted. The distance between the top, center and bottom parts of the individual segments or also of the continuous disc-shaped parts can be fixed by e.g. distance pieces or spacers (not shown here), which also enhances structural stability of the tool holding device.

One or more inventive tool holding devices can be—preferably as an insert to a tool holding plate unit—mounted on a shaft (e.g. one above each other) to enable a sufficiently high loading density by forming a tool holding tree. The distance between the individual tool holding devices or tool holding plate units, respectively, can be achieved by e.g. distance pieces or spacers on the shaft (not shown here). It is also possible that the tool holding device can be manufactured in a way that the tool holders and/or sleeves are inclined in an angle of 10 to 45° from the main axis of the shaft, whereon the tool holding device is mounted.

An additional embodiment of the present invention is that the inventive tool holding plate unit, further comprises a protective ring, which can be attached at the outer diameter of the tool holding plate unit. During e.g. cleaning the protective ring can be omitted to enable for optimum liquid cleaning media flow around the tools. If this protective ring is however attached, it prevents from e.g. excessive erosion of the tool holders during pretreatment or deposition of coating material at the shank of the tools during deposition. The protective ring should have at maximum the same height as the tool holding device. In case where the means for enabling three-fold rotation of the tool holder and/or sleeve are located in a manner that the tool holder and/or sleeve is brought into rotation from outside, the protective ring should not cover the region where e.g. the trigger grabs into the tool holder and/or sleeve.

Alternatively, it is also possible that the tool holding device comprises a combination of inventive sleeves (i.e. comprising one or more openings), being assembled in a continuous or segmented top part and optionally a lock washer part, with a continuous or segmented bottom part, whereon closed tool holders (i.e. without openings in the mantle part) are located. This assembly also allows treatment of the tools in the area needed, whereas easy handling of the whole top part, including the tools in the sleeves, avoids the need for touching the individual tools.

Figure 4:
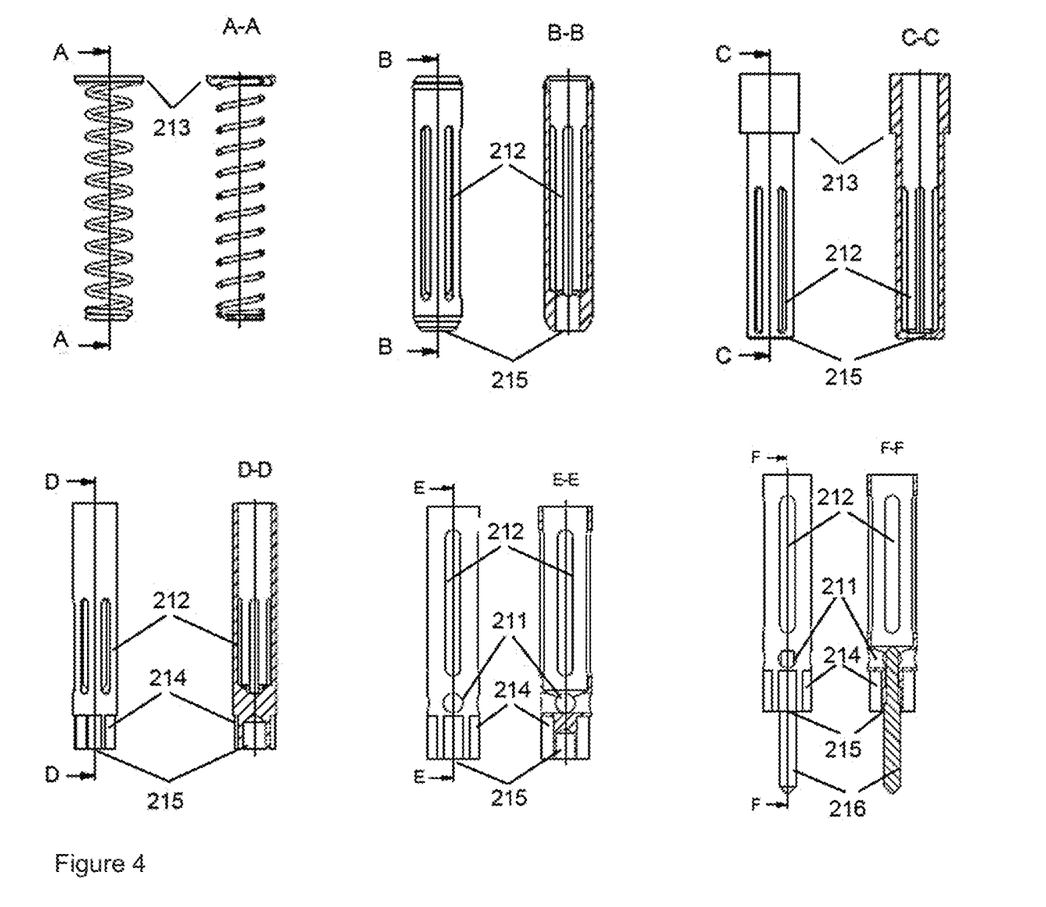
FIG. 4: A schematic illustration of several examples of inventive tool holders and/or sleeves.

FIG. 4 shows some examples of inventive tool holders and/or sleeves, which all have in common at least one opening in the mantle 13 and/or base region 15 of the respective sleeve, which allow fluid and/or solid treatment agents and react with the tool surface and afterwards exit the sleeve before a subsequent process step is applied. The openings can be holes 211 and/or slits 212. Optionally the tool holders and/or sleeves can exhibit one or more recesses or lugs 213 in the top region 11. This or these may form a kind of collar, which ensures that e.g. a sleeve can be easily installed in a tool holder or that e.g. a tool holder can be easily installed in uptake holes 37 of the tool holding device. Further, the tool holder and/or sleeve can comprise protruding noses (as already known from FIG. 1) or intruding notches 214, central bore holes 215, as well as central pins 216. The central pins may be designed as height adjustable stops that define how deep an individual shank can be stuck into the tool holder.

In the easiest fashion, the tool holder and/or adapter can be made from a spring-shaped element 21, which can exhibit a recess 213 (e.g. a kind of collar by an additional winding of the spring) in order to make sure that e.g. the adapter 20 can be mounted in a tool holder or that the tool holder 10 can be mounted in a tool holding device. The open mantle area of such a tool holder 10 and/or such a sleeve 20 can be regarded as one continuous opening in the context of the present invention. See what is shown by FIG. 4 first line left hand.

Another example shows a tool holder or sleeve with more than one slit 212 in the mantle region 13 and a central hole 215 in the bottom of the base region 15. See what is shown by FIG. 4 first line middle.

Another example exhibits a recess 213 in the top region 15 and several slits 212 along the mantle region 13, which are continued down to the base region 15 of the tool holder or sleeve, where a central hole 215 is located. See what is shown by FIG. 4 first line right hand.

Another example exhibits at least one slit 212 in the mantle region 13, being realized in a distinct angle at the lower end of the slit to ensure that any dry or fluid media can exit the tool holder. The base region 15 further comprises notches 214, enabling for transfer of motion for three-fold rotation, and a center bore hole 215 being not bored through the base region 15, which is intended as an uptake for centering pins on a base part. See what is shown by FIG. 4 second line left hand.

Another example shows an alternative to the previous example with at least one slit 212 in the mantle region 13 and additional holes 211 at the bottom of the mantle region. Central bore hole 215 and notches 214 are executed similar to the previous example 24. See what is shown by FIG. 4 second line middle.

Another example shows at least one slit 212 in the mantle region 13, additional holes 211 at the bottom of the mantle region and a central bore hole 215, wherein a central pin 216 can be inserted and fixed (e.g. by pressing), which allows only point contact of the tool at its base. See what is shown by FIG. 4 second line right hand.

The above mentioned examples of tool holders and/or sleeves given above are intended to show some possible, particular advantageous shapes of the present invention but not to limit the scope of it unless being part of claim wording. The bottom part can thereby exhibit uptake holes for the tools holders or pins to ensure stable rotation during operation.

It has been found by the inventors that shank type tools being once inserted in an inventive tool holding device can firstly be easily handled during and between the individual process steps, and secondly the surface quality of the produced parts can be enhanced. An improved coating adhesion, lower surface defects and improved coating property and thickness homogeneity can be achieved by using the inventive tool holding device.

It has been found to be beneficial if the shank type tools are fixed inside the tool holder and/or sleeve only by being inserted and due to their own weight. The tool holder and/or sleeve should in best practice only exhibit "point-contact" with one or more parts of the tool. This enhances the removal of the e.g. cleaning or pre-/posttreatment agents. One has however to ensure that enough contact area between the tool and the tool holder and/or sleeve is present so that the three-fold rotation of the tool holder and/or sleeve also catches the tool.

As explained above, the three-fold rotation of the tool holder and/or sleeve can e.g. be triggered by springs or other constructive means, which in the easiest case grab into the notches of a tool holder. It is an embodiment of the present invention that the constructive means for transfer of motion, enabling three-fold rotation of the tool holder and/or sleeve, can be placed outside the tool holding device or at the inner side of the tool holding device. This can be e.g. achieved that the trigger finger (or spring) is mounted on a disc, which is rotating in double rotation such as the shaft and thus the tool holding device. Thereby the trigger can be e.g. mounted outside the tool holding device or in some cases also inside the tool holding device.

It is thus a preferred embodiment of the present invention that the constructive means for triggering three-fold rotation of the tool holder and/or sleeve are located inside the tool holding device. This is especially beneficial if a protective ring is attached at the outside of the tool holding device, because it does not collide with the trigger. It should be mentioned that the notches 214 can also be positioned along the mantle 13 or top region 11 of a tool holder and/or sleeve.

Also the utilization of one or more pins to prevent the tool from too large contact area at the bottom of the tool holder and/or sleeve is a preferred embodiment of the present invention. Such an arrangement further allows that the tool holder can be mounted in the base plate of the tool holding device, as exemplarily depicted by what is shown by FIG. 3 second line left hand and middle.

It can be considered that the tool holding device could be made of any electrically conductive, corrosion resistant, and temperature resistant material in the region of −50 to +700° C. This is necessary in order to withstand the exposure to e.g. blasting with carbondioxide at temperatures of ~−35° C., as well as coating material at high deposition temperatures of up to −650° C. It is however a preferred embodiment of the present invention that the tool holding device is built from steels, hereby especially corrosion and temperature resistant steels such as e. g. DIN 1.4301, 1.4307 1.4541, 1.4404 or 1.4571, which have a low thermal expansion coefficient, and sufficient electrical conductivity to ensure that the tools have electrical contact during the e.g. the deposition process where a bias potential is applied.

The inventors found that the present invention can be used for shank type tools of almost any arbitrary diameter and length. This is possible because the tool holding device exhibits a high versatility for combination of sleeves for tools with small diameter and tool holders with an inner diameter that can uptake the sleeve. In an example a drill of 6 mm diameter can be positioned in a sleeve, which is further mounted in a tool holder, which would be usually used for 10 mm drills.

The inventors further found that the reduction of the total handling costs, using the inventive tool holding device, can be considerable. It is intended in the future that the inventive tool holding device is provided to the original tool manufacturer and/or regrinder, who loads the shank type tools only once in the tool holders and/or sleeves, before starting the process chain. The inventive tool holding device is used throughout the whole process chain, which involves the delivery or transport of the tools to the surface treatment facility, which can be e.g. a job coater or surface treatment specialist. After assembly of the one or more inventive tool holding devices on a shaft, the tools are usually cleaned in ultrasonic liquid cleaning bathes, before being dried and transferred to an optional pretreatment facility. As mentioned above, an optional protective ring can be attached around the tool holding device, depending to the used pretreatment media. After every pretreatment step, which can be more than one, the dust and/or remaining treatment media is blow away with e.g. dry air or an inert gas. The next step is usually performed in a deposition plant, wherein heating, plasma etching, optionally nitriding, carborizing, or the like, of the tools and finally the deposition of the coating material take place. After the coating step, the tools can optionally be posttreated and cleaned before the tool holding device is disassembled from the shaft and being sent back to the customer. Though other process steps are also possible in between the above mention process chain, it can be clearly seen that the inventive tool holding devices allows for efficient reduction of handling effort and damage risk.

According to one preferred embodiment of the present invention the inventive tool holder can be placed in an arrangement comprising:

a rotatable carrousel for conducting a first rotation (1-fold rotation) when the carrousel rotates about the own rotation axis, a holding tree comprising at least one holding device circumferentially mounted on the carrousel, the holding device comprising a rotatable carrier plate disposed movable in relation to the carrousel for conducting a second rotation (2-fold rotation) when the carrier plate rotates about the own rotation axis one inventive rotatable tool holder or more circumferentially mounted on the carrier plate, the tool holder being disposed movable in relation to the carrier plate for conducting a third rotation (3-fold rotation) when the tool holder rotates about the own rotation axis The present invention discloses also a tool holding device (30) for holding one or more shank type tools (90), comprising one or more tool holders (10) arranged on a first plate (31), at an equidistant position regarding a central vertical rotation axis of the first plate, said tool holder (10) comprising one receptor opening for receiving a tool with a tip area to be hold, the receptor opening being designed for allowing the tip area of the tool being uncovered, the tool holder (10) arranged being movable in relation to the first plate (31), in such a manner that the tool holder (10) can rotate regarding its own central vertical axis, wherein the tool holder (10) comprises at least one further opening for allowing liquid and/or solid substances passing through and leaving the tool holder (10), in such a manner that, when a tool is held by the tool holder (10), at least a portion of the tool surface placed inside the tool holder (10) can be put in contact with the substances and can also afterward be set free from the substances, if the substances are not strong adhered to said portion of the tool surface, and the holding device (30) comprises one or more covering parts that cover lateral surfaces of the tool that are placed inside the tool holder (10).

The above mentioned tool holding device (30) can have one or more of the covering parts being removable.

The tool holder of a tool holding device (30) according to the present invention can comprise a sleeve (20) or is a sleeve (20).

Generally one can say that it is given thought to claim—even independently from already drafted claims—protection for a tool holding device that is designed that way that it exhibits the features of one or more of the following paragraphs, alone or in combination with other features disclosed by the claims, the drawings and the specification of this invention disclosure.

A tool holding device (30) for shank type tools (90), comprising at least one tool holder (10), a base part (35) and a top part (31), whereby at least the top part (31) comprises uptake holes (37) for the at least one tool holder (10) characterized in that—the tool holding device (30) can be used for more than one process step among transfer, cleaning, pretreatment, coating, posttreatment, —each of the at least one tool holder (10) can optionally take up a sleeve (20) holding the shank type tool (90) in a distinct, preferably upright position, —the at least one tool holder (10) and/or sleeve (20) comprise one or more openings, which allow fluid and/or solid treatment agents to exit the tool holder (10) and/or sleeve (20), —the at least one tool holder (10) and/or sleeve (20) enables three-fold rotation of the shank type tool (90).

A tool holding device (30) that exhibits a lock washer part (33) is placed between the top part (31) and the base part (35).

A tool holding device (30) hat comprises one or more distance pieces, which keep a distinct distance between the top part (31), the base part (35) and the optional lock washer part (33).

A tool holding device (30) whereas the tool holding device (30) is composed of continuous structural elements, comprising at least a disc shaped base part (35), a top part (31), and optionally a lock washer part (33).

A tool holding device (30) which is composed of segmented structural elements, being each built up from the group of a segmented base part (351), a segmented top part (311), and optionally a segmented lock washer part (331).

A tool holding device (30) being designed that way, that two or more of the segmented structural elements can be combined to a tool holding device (30) with a continuous outer diameter.

A tool holding device (30) with segmented structural elements whereas the segmented structural elements can exhibit a different number and size of uptake holes 37, which can thus carry tool holders and/or sleeves of different number and size.

A tool holding device (30) with constructive means (39) for enabling three-fold rotation that are located outside the tool holding device (30).

A tool holding device (30) with constructive means (39) for enabling three-fold rotation that are located inside the tool holding device (30).

A tool holding device (30) being special in that way that a protective ring, covering at least a portion of the total height of the tool holding device, can be attached for at least one process step around the outer diameter of the tool holding device (30).

A tool holding device (30) being special that way that the openings of the tool holder (10) and/or sleeve (20) are either one or more holes (211), slits (212), center holes (215) or a combination therefrom.

A tool holding device (30) according to any of the preceding paragraphs being particular in that a central pin (216) is installed in the center of a tool holder (10).

A method for using a tool holding device (30) for shank type tools (90), comprising at least one tool holder (10), a base part (35) and a top part (31), whereby at least the top part (31) comprises uptake holes (37) for the at least one tool holder 10 and/or sleeve (20) characterized in that
- the tool holding device (30) can be used for more than one process step among transfer, cleaning, pretreatment, coating, posttreatment,
- the at least one tool holder (10) and/or sleeve (20) holds the shank type tool (90) in a distinct, preferably upright position,
- the at least one tool holder (10) and/or sleeve (20) comprise one or more openings, which allow fluid and/or solid treatment agents to exit the tool holder (10) and/or sleeve (20),
- the at least one tool holder (10) and/or sleeve (20) enables three-fold rotation of the shank type tool (90).

LIST OF REFERENCE NUMBERS 10 tool holder
11 top region
13 centre region
15 base region
20 sleeve
21 spring shaped element
30 tool holding device
31 carrier plate
33 centre part or lock washer part
34 spacer
35 base part
37 uptake whole
39 constructive means for enabling 3-fold rotation (rotation around the tertiary axis)
90 shank type tool
151 notches
152 round protrusion
211 hole
212 slit
213 lug
214 intruding notch
215 central bore hole
216 central pin
311 segmented top part
351 segmented base part
331 segmented lock washer parts
400 carousel
401 primary axis
402 carousel base plate
403 tool holding tree
404 secondary axis
405 tool holding plate unit
406 tertiary axis
410 plate
411 circumferential jacket
412 hub
413 partition plate
414 compartment
415 pin
416 hole for pin reception
417 disc plate of the hub
418 leaf spring
Rot 1 rotational movement path 1
Rot 2 rotational movement of the individual tool holder around the tertiary axis 406

The invention claimed is:

1. A tool holding device for shank type tools, comprising: at least one tool holder for holding a shank type tool in a distinct upright position and in rotatable manner, the tool holder being equipped with a topside tool or adapter insertion opening a base part and a top part, whereby at least the top part comprises uptake holes for the at least one tool holder, and whereas the base part forms a support and/or uptake and/or guide for the at least one tool holder, and whereas the base part and the top part are interconnected to each other by means of at least one spacer, wherein the at least one tool holder comprises one or more escape openings which are positioned in vertical direction below the tool or adapter insertion opening and which allow fluid and/or solid treatment agents to exit the tool holder such that the tool holding device can be used for more than one process step among transfer, cleaning, pretreatment, coating, posttreatment, wherein the tool holding device comprises at least one adapter, wherein the adapter is intended to hold the shank type tool to adopt for different tool diameters of the tool holder and the shank type tool, wherein the adapter can be optionally inserted in the tool holder, wherein the adapter has the form of sleeve or tube with a defined outside diameter as required by the tool holder for pairing and a defined internal diameter as required by the shank of the tool for pairing.

2. The tool holding device of claim 1, wherein the adapter is designed to be stuck through the tool or adapter insertion opening of the at least one tool holder into the at least one tool holder and to be held by the tool holder in a defined position, whereas the adapter comprises one or more escape openings, which are positioned in vertical direction below a tool insertion opening of the adapter and which allow fluid and/or solid treatment agents to exit the adapter.

3. The tool holding device of claim 1, wherein the one or more escape openings of the tool holder or the tool holder and the adapter are lateral openings related to the longitudinal axis of the tool holder or of the adapter, which longitudinal axis extends through the topside insertion opening and an underside of the tool holder or adapter.

4. The tool holding device of claim 1, wherein the tool holder and/or the adapter comprises a form fit operable drive means designed to contribute making the tool holder and/or the adapter rotate around its longitudinal axis.

5. The tool holding device of claim 1, wherein a lock washer part is provided between the base part and the top part.

6. The tool holding device of claim 5, wherein the base part, the top part and the lock washer part have the shape of an arc of a circle confined by two radii and two arcs.

7. A tool holding plate unit for shank type tools, comprising: at least one tool holding device according to claim 1 and a plate taking up the at least one tool holding device in a defined position, whereas the plate possesses a central hub for fixing the tool holding plate unit to a stem of a tool holding tree and a circumferential jacket.

8. The tool holding plate unit of claim 7, wherein the hub comprises form fit means nesting with complementary form fit means of the tool holding device, so that the tool holding device is locked in a predetermined position on the tool holding plate unit, in the interspace between the hub and the circumferential jacket, whereas said locking is designed such that it prevents the tool holding device from rotating relative to the tool holding plate unit.

9. The tool holding plate unit of claim 8, wherein said locking can be established and released without the need of using a tool, by straight lifting of the tool holding device or characterized in that a quick-lock device is used.

10. The tool holding plate unit of claim 7, wherein the at least one tool holding device is equipped with at least one coupler protrusion extending in radial outward direction and/or extending outside above the base plate and being formed as an integral part of the spacer, whereas the coupler protrusion is formed such that it can be coupled to a lifting tool in the shape of a lifting pincer.

11. The tool holding plate unit of claim 7, wherein the plate and/or the hub carries driver means designed to interact with drive means of the tool holder or adapter to make the tool holder and/or the adapter rotate around its longitudinal axis relative to the tool plate holding unit.

12. A tool holding carousel for layer deposition within a deposition chamber rotating under operation around a primary axis of rotation relative to the deposition chamber and comprising at least one tree comprising itself a number of tool holding plate units according to claim 7, whereas the tool holding plate units are carried one above the other by a secondary axis of rotation rotating itself relative to the carousel, whereas the tool holders being part of the tool holding devices carried by the tool holding plate units are rotating under operation around their longitudinal axes within the tool holding devices and relative to the tool holding plate units, their longitudinal axes forming a tertiary axis of rotation.

13. Multiple purpose use of a tool holding device according to claim 1 for layer deposition and at least one of the following process steps: transfer, cleaning, pretreatment and/or posttreatment.

14. Multiple purpose use of a system comprising tool holding devices according to claim 1 and different tool holding plate units, characterized in that the tool holding devices are taken up by at least one first "deposition type" tool holding plate unit for layer deposition, while the same tool holding devices are taken up by a different "other purpose type" tool holding plate unit for transfer, cleaning, pretreatment and/or posttreatment.

15. A method for using a tool holding device for shank type tools, comprising at least one tool holder, a base part and a top part and at least one adapter, wherein the adapter is intended to hold the shank type tool to adopt for different tool diameters of the tool holder and the shank type tool, wherein the adapter can be optionally inserted in the tool holder, wherein the adapter has the form of sleeve or tube with a defined outside diameter as required by the tool holder for pairing and a defined internal diameter as required by the shank of the tool for pairing, whereby at least the top part comprises uptake holes for the at least one tool holder and/or sleeve, wherein:
- the tool holding device can be used for more than one process step among transfer, cleaning, pretreatment, coating, posttreatment,
- the at least one tool holder and/or sleeve holds the shank type tool in a distinct, upright position,
- the at least one tool holder and/or sleeve comprises one or more openings, which allow fluid and/or solid treatment agents to exit the tool holder and/or sleeve,
- the at least one tool holder and/or sleeve enables threefold rotation of the shank type tool.

* * * * *